United States Patent
Iwai et al.

(10) Patent No.: US 7,852,691 B2
(45) Date of Patent: Dec. 14, 2010

(54) SEMICONDUCTOR MEMORY DEVICE USING DYNAMIC DATA SHIFT REDUNDANCY SYSTEM AND METHOD OF RELIEVING FAILED AREA USING SAME SYSTEM

(75) Inventors: Takayuki Iwai, Setagaya-ku (JP); Mariko Iizuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 12/209,787

(22) Filed: Sep. 12, 2008

(65) Prior Publication Data

US 2009/0073778 A1 Mar. 19, 2009

(30) Foreign Application Priority Data

Sep. 14, 2007 (JP) ............................ P2007-238855

(51) Int. Cl.
*G11C 29/00* (2006.01)
*G11C 7/00* (2006.01)

(52) U.S. Cl. ............. 365/200; 365/189.05; 365/230.03; 365/230.08

(58) Field of Classification Search ............ 365/189.05, 365/200, 230.03, 230.08
See application file for complete search history.

(56) References Cited

U.S. PATENT DOCUMENTS

| | | | | |
|---|---|---|---|---|
| 5,574,729 | A * | 11/1996 | Kinoshita et al. | ............ 714/711 |
| 6,198,649 | B1 * | 3/2001 | Matsudera et al. | ............ 365/63 |
| 6,804,155 | B2 * | 10/2004 | Fukuda | ..................... 365/200 |
| 6,865,126 | B2 | 3/2005 | Fukuda | |
| 6,952,372 | B2 * | 10/2005 | Tsuji | ......................... 365/200 |
| 7,301,833 | B2 | 11/2007 | Komura | |

FOREIGN PATENT DOCUMENTS

JP 2004-118920 4/2004

* cited by examiner

*Primary Examiner*—VanThu Nguyen
(74) *Attorney, Agent, or Firm*—Oblon, Spivak, McClelland, Maier & Neustadt, L.L.P.

(57) ABSTRACT

A semiconductor memory device comprises a plurality of submacros mutually connected via global data lines. Each of the submacros includes a first and a second memory block, and a memory block control circuit arranged between the first and second memory blocks. The memory block control circuit includes a DQ buffer block connected to the first memory block via first complementary data lines and connected to the second memory block via second complementary data lines. It also includes a dynamic data shift redundancy circuit block connected to the DQ buffer block via local data lines and operative to relieve the first and second memory blocks.

9 Claims, 11 Drawing Sheets

SEMICONDUCTOR MEMORY DEVICE USING DYNAMIC DATA SHIFT REDUNDANCY SYSTEM AND METHOD OF RELIEVING FAILED AREA USING SAME SYSTEM

CROSS-REFERENCE TO RELATED APPLICATION

This application is based on and claims the benefit of priority from prior Japanese Patent Application No. 2007-238855, filed on Sep. 14, 2007, the entire contents of which are incorporated herein by reference.

BACKGROUND OF THE INVENTION

1. Field of the Invention

The present invention relates to a semiconductor device comprising a redundancy circuit for relieving a failed data line.

2. Description of the Related Art

There have been redundancy systems in semiconductor memory devices such as DRAMs to replace a failed cell with a redundancy cell as known in the art. A conventional common fixed data shift redundancy system comprises DQ buffer blocks operative to amplify data and fixed data shift redundancy circuit blocks in each relief target memory block. Namely, the ability of a fixed data shift redundancy circuit block is limited to relieve only one memory block (one relief area) (Patent Document 1: JP 2004-118920A).

Expansion of submacros in the conventional system requires the DQ buffer block and the fixed data shift redundancy circuit block to be arranged in each relief area, which presses the chip area. A reduction in the number of DQ buffer blocks inside the DRAM for the purpose of reducing the area increases the relief areas and lowers the relief efficiency as a problem.

SUMMARY OF THE INVENTION

In an aspect the present invention provides a semiconductor memory device, comprising a plurality of submacros mutually connected via global data lines, each of the submacros including a first and a second memory block, and a memory block control circuit arranged between the first and second memory blocks, the memory block control circuit including a DQ buffer block connected to the first memory block via first complementary data lines and connected to the second memory block via second complementary data lines, and a dynamic data shift redundancy circuit block connected to the DQ buffer block via local data lines and operative to relieve the first and second memory blocks.

In another aspect the present invention provides a semiconductor memory device, comprising: a first and a second memory block; a DQ buffer block connected to the first memory block via first complementary data lines and connected to the second memory block via second complementary data lines; and a dynamic data shift redundancy circuit block connected to the DQ buffer block via local data lines and operative to relieve the first and second memory blocks in accordance with information of one bit in an arbitrary address received from external.

In yet another aspect the present invention provides a semiconductor memory device, comprising a plurality of submacros each including a first and a second memory block, a certain one of the submacros, independent of the other of the submacros, including a DQ buffer block connected to the first memory block via first complementary data lines and connected to the second memory block via second complementary data lines, and a dynamic data shift redundancy circuit block connected to the DQ buffer block via local data lines and operative to relieve the first and second memory blocks.

DETAILED DESCRIPTION OF THE EMBODIMENTS

The embodiments of the invention will now be described with reference to the drawings.

Figure 1:
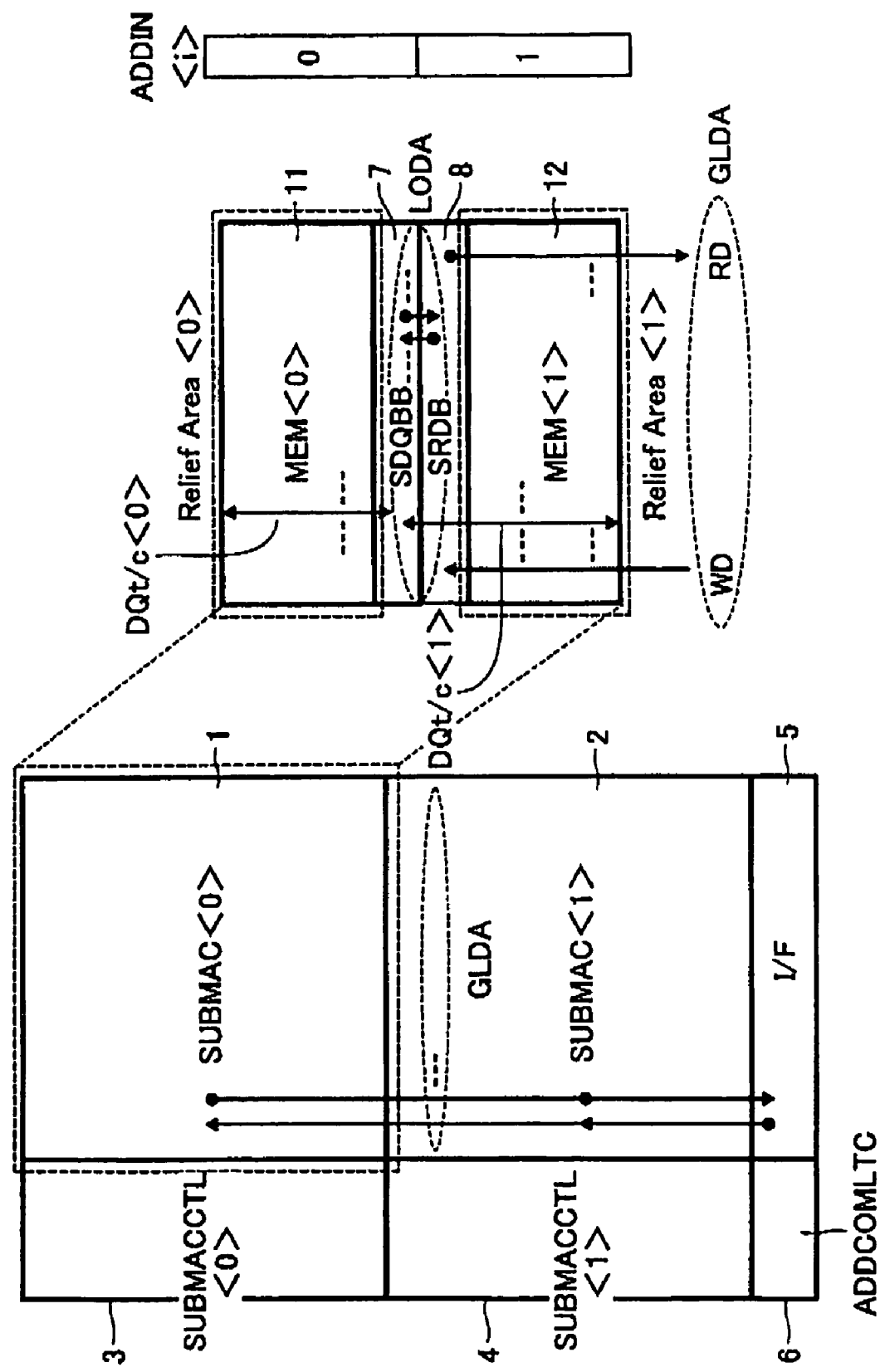
FIG. 1 provides a diagram showing a configuration of the major part of a DRAM according to a first embodiment of the present invention.

FIG. 1 shows a configuration of the major part of a DRAM according to one embodiment of the present invention. A memory area comprises a plurality of submacros (SUBMAC<0>, <1>) 1, 2. The submacros 1, 2 are connected to submacro control circuits (SUBMACCTL<0>, <1>) 3, 4 operative to control these submacros, respectively. The submacros 1, 2 are provided with a common interface unit (I/F) 5 for information communications with external. The interface unit 5 is connected to the plurality of submacros 1, 2 through a plurality of global data lines GLDA. The global data lines GLDA include a plurality of global write data lines WD and a plurality of global read data lines RD. The interface unit 5 is connected to the submacro control circuits 3, 4 via an address command latch circuit (ADDCOMLTC) 6. The address command latch circuit 6 has a function of latching an address signal and a command signal received from external and sending the address signal and the command signal to the submacro control circuits 3, 4.

The submacros 1, 2 comprise a first relief area <0> or a first memory block (MEM<0>) 11, and a second relief area <1> or a second memory block (MEM<1>) 12. It also comprises a DQ buffer block (SDQB) 7 and a dynamic data shift redundancy circuit block (SRDB) 8, which are arranged between the memory blocks 11, 12 and shared by the memory blocks 11, 12. The DQ buffer block 7 amplifies data signals on a plurality of complementary data lines DQt/c<0>, <1> connected to the memory blocks 11, 12. The dynamic data shift redundancy circuit block 8 dynamically selects a relief area and relives the memory blocks 11, 12 during DRAM operation.

Inside the submacros 1, 2, the plurality of global data lines GLDA are connected to the dynamic data shift redundancy circuit block 8. The dynamic data shift redundancy circuit block 8 is connected to the DQ buffer block 7 through a plurality of local data lines LODA. The DQ buffer block 7 is connected to the memory block 11 via the plurality of complementary data lines DQt/c<0>. The DQ buffer block 7 is connected to the memory block 12 via the plurality of complementary data lines DQt/c<1>.

A specific 1-bit address ADDIN<i>=0 fed from external is assigned to the relief area <0>. A specific 1-bit address ADDIN<i>=1 fed from external is assigned to the relief area <1>.

Figure 2A:
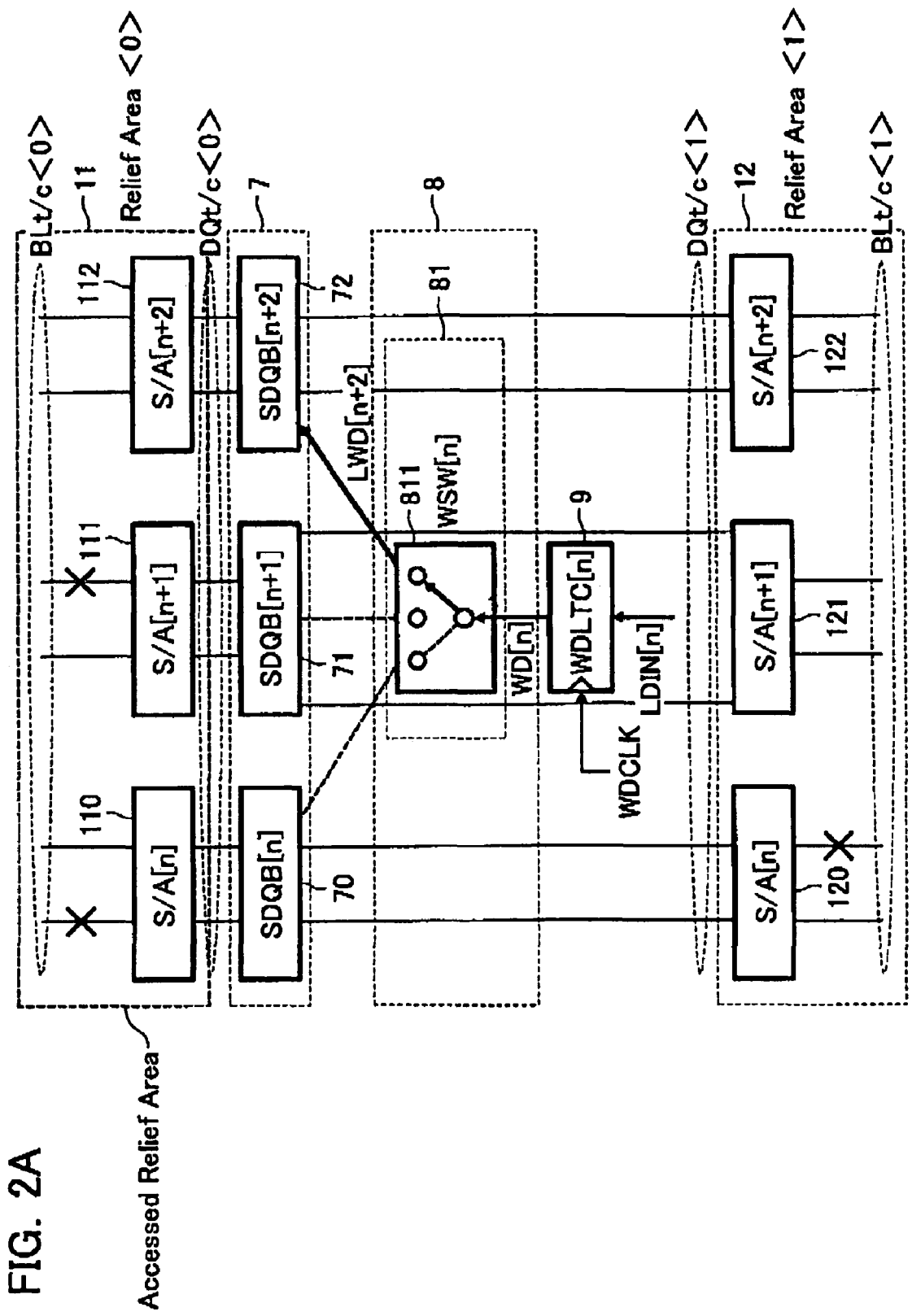
FIG. 2A is a block diagram showing a more detailed configuration of a DQ buffer block, a dynamic data shift redundancy circuit block and periphery circuits thereof according to the same embodiment.
Figure 2B:
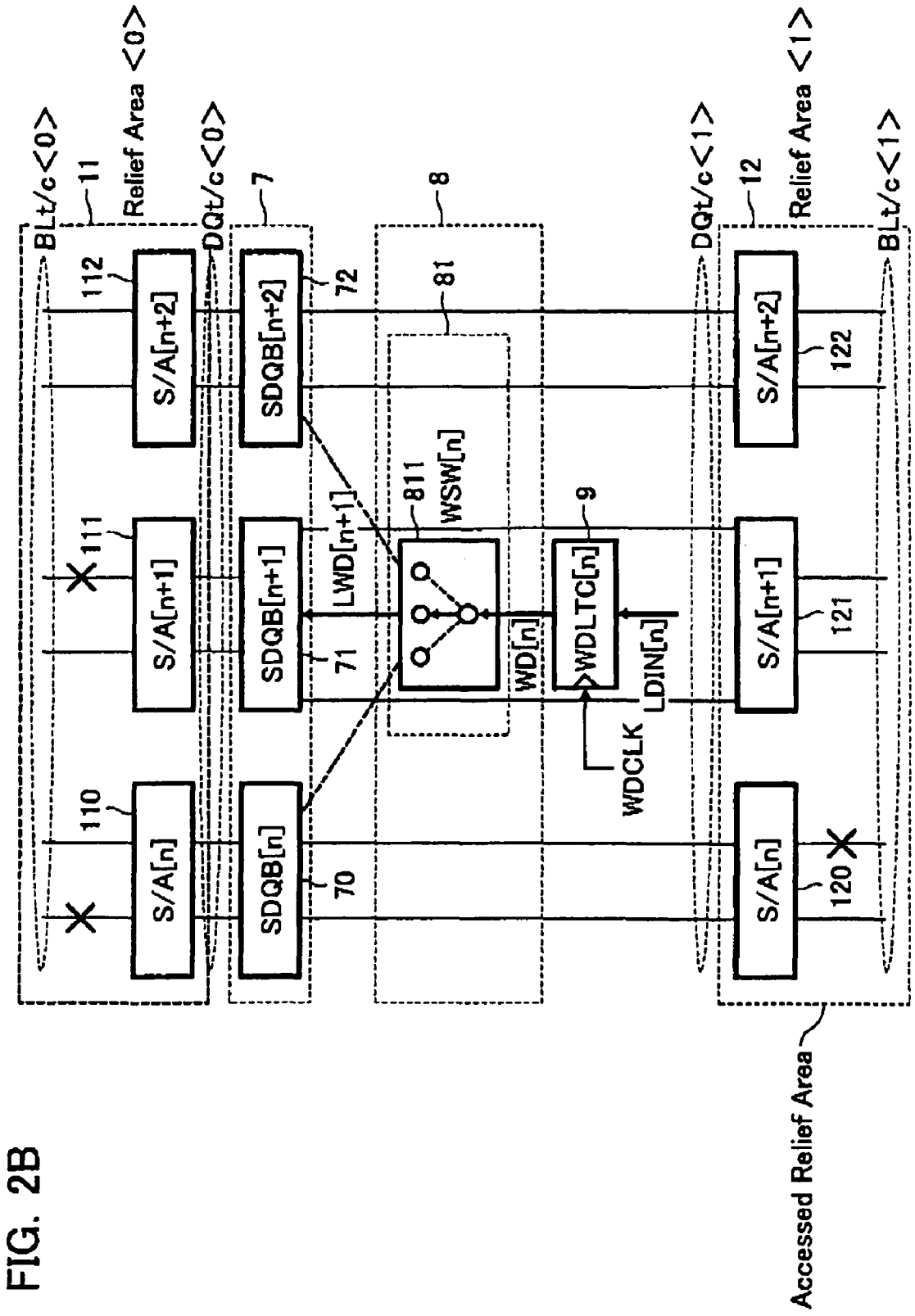
FIG. 2B is a block diagram showing a more detailed configuration of a DQ buffer block, a dynamic data shift redundancy circuit block and periphery circuits thereof according to the same embodiment.

FIGS. 2A, 2B are block diagrams showing a more detailed configuration of the shared DQ buffer block, the dynamic data shift redundancy circuit block 8 and periphery circuits thereof.

The shared DQ buffer block 7 includes a plurality of shared DQ buffers (SDQB) 70, 71, 72 corresponding to the complementary data lines DQt/c<0>, <1>. The memory blocks 11, 12 include a plurality of sense amplifier circuits (S/A[n]–[n+2]) 110, 111, 112, 120, 121, 122 operative to amplify signals read out of internal memory cells and signals to be written in internal memory cells.

The dynamic data shift redundancy circuit block 8 includes a plurality of dynamic data shift redundancy circuits 81 each having a write switch (WSW[n]) 811. The shown example makes it possible to switch among three complementary data lines DQt/c per relief area. A local data-in signal LDIN[n] from the interface unit 5 is latched at a write data latch (WDLTC[n]) 9 in accordance with a write data latch timing clock WDCLK. The write data latch 9 is connected to the write switch 811 via global write data lines WD[n]. The output of the write switch 811 is connected to three shared DQ buffers 70, 71, 72 via three local write data lines LWD[n]–[n+2]. The shared DQ buffers 70-72 are connected to sense amplifier circuits 110-112 via the complementary data lines DQt/c<0> and connected to sense amplifier circuits 120-122 via the complementary data lines DQt/c<1>. The sense amplifier circuits 110-112 and 120-122 are connected to a plurality of memory cells via the complementary bit lines BLt/c. Although omitted from FIGS. 2A and 2B to give attention to the write switch WSW[n], there are write switches WSW[n+1], WSW[n+2] corresponding to the DQ buffers SDQB[n+1], SDQB[n+2] in practice.

The following description is given to write operation in the DRAM thus configured according to the present embodiment.

In FIG. 2A, data fed from external via the interface unit 5 to be written in a memory cell is latched at the write data latch 9 as the local data-in signal LDIN[n]. The data latched in the write data latch 9 is transferred via the global write data lines WD[n] to the write switch 811.

The relief area <0> or the memory block 11 may be accessed as shown in FIG. 2A. In this case, the complementary bit lines BLt/c<0> connected to the sense amplifier circuits 110, 111 include failed points as shown with marks "×" in the figure. Accordingly, the write switch 811 selects the shared DQ buffer 72 connected to the sense amplifier circuit 112 having no failed point.

The relief area <1> or the memory block 12 may be accessed as shown in FIG. 2B. In this case, the complementary bit lines BLt/c<1> connected to the sense amplifier circuit 120 include a failed point as shown with a mark "×" in the figure. Accordingly, the write switch 811 selects the shared DQ buffer 71 connected the sense amplifier circuit 121 located closer to the left side of the sense amplifier circuits 121, 122 having no failed point.

Figure 3:
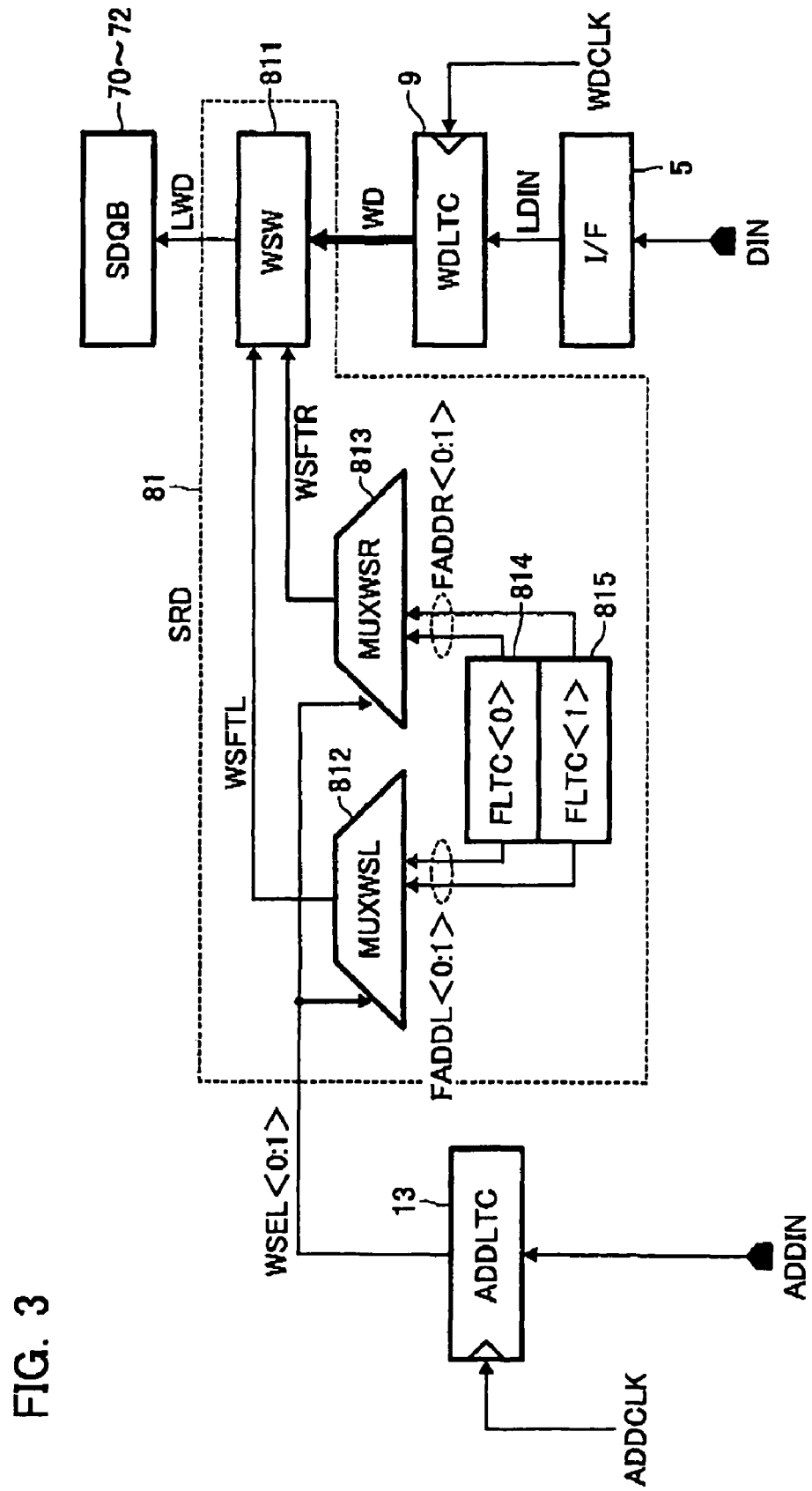
FIG. 3 is a block diagram showing in detail the periphery of the dynamic data shift redundancy circuit block at the time of write in the same embodiment.

FIG. 3 is a block diagram showing in detail an internal configuration of one of plural dynamic data shift redundancy circuits (SRD) 81 contained in the dynamic data shift redundancy circuit block 8, the input/output of signals, and relations between other characteristic circuit blocks, in write operation. Inside the dynamic data shift redundancy circuit 81, the write switch 811 is connected to a leftward shift determination multiplexer circuit (MUXWSL) 812 for write via a leftward shift determination signal line WSFTL for write. The write switch 811 is also connected to a rightward shift determination multiplexer circuit (MUXWSR) 813 for write via a rightward shift determination signal line WSFTR for write. There are failed address latches (FLTC<0>, <1>) 814, 815 operative to store failed address information associated with relief areas. As areas relieved by one dynamic data shift redundancy circuit 81 are always only 2 in number, the failed address latches 814, 815 are present only 2 in number. In this case, the failed address latch 814 holds the failed address information on the relief area <0> and the failed address latch 815 holds the failed address information on the relief area <1>. The leftward shift determination multiplexer circuit 812 for write is given failed address data signals from the failed address latches 814, 815 via failed address data lines FADDL<0:1>. The rightward shift determination multiplexer circuit 813 for write is given failed address data signals from the failed address latches 814, 815 via failed address data lines FADDR<0:1>.

The leftward shift determination multiplexer circuit 812 for write and the rightward shift determination multiplexer circuit 813 for write are connected to the output of an address latch (ADDTLC) 13 via a relief area selection signal line WSEL<0:1> for write. The address latch 13 latches an address ADDIN received from external in synchronization with a rise edge of an address latch timing clock ADDCLK.

Write data is fed as a data-in signal DIN into the interface unit 5 and then sent to the DQ buffers 70-72 as the local data-in signal LDIN, the global write data signal WD, and the local write data signal LWD in order as described earlier.

Figure 4:
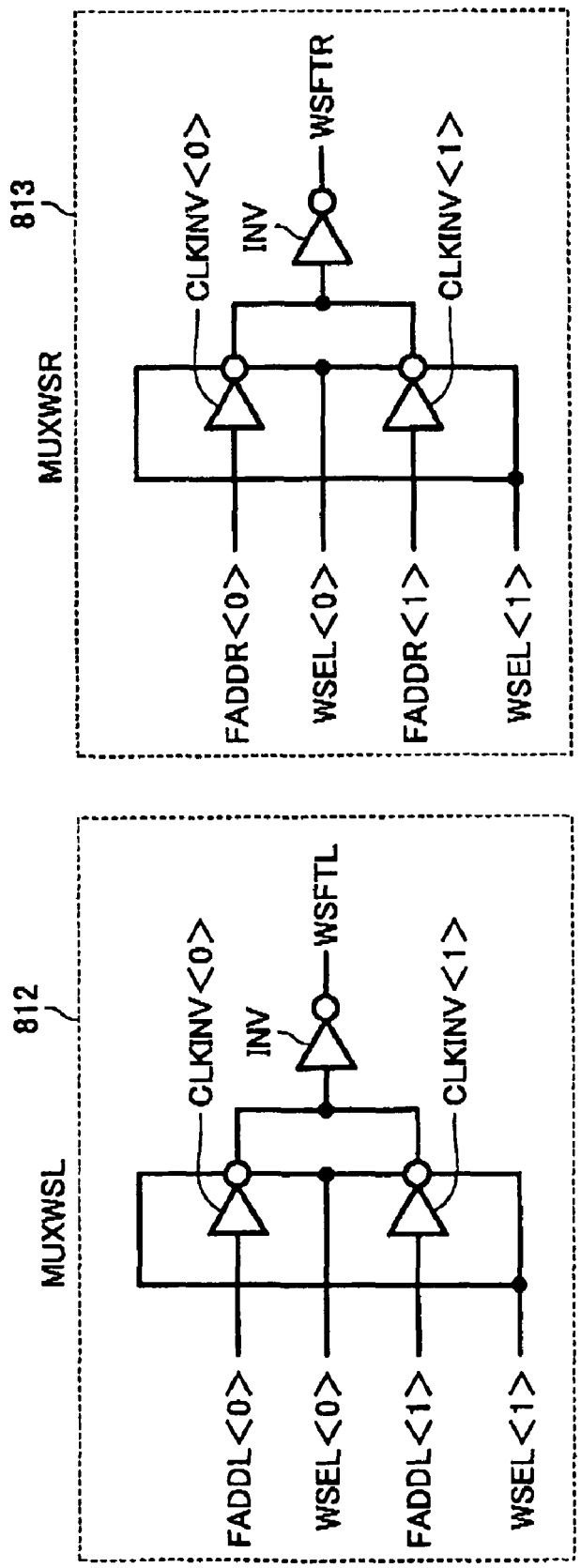
FIG. 4 is a detailed circuit diagram of a multiplexer circuit for write in the same embodiment.

FIG. 4 shows detailed circuitry of the leftward shift determination multiplexer circuit 812 for write and the rightward shift determination multiplexer circuit 813 for write. The leftward shift determination multiplexer circuit 812 for write and the rightward shift determination multiplexer circuit 813 for write each comprise two clocked inverters CLKINV<0:1> and one inverter INV. The outputs of the two clocked inverters CLKINV<0:1> are connected to the input of the inverter INV. The output of the inverter INV in the leftward shift determination multiplexer circuit 812 for write is connected to a leftward shift determination signal line WSFTL for write. A failed address data signal FADDL for MUXWSL and a relief area selection signal WSEL for write are fed into one clocked inverter CLKINV. The output of the inverter INV in the rightward shift determination multiplexer circuit 813 for write is connected to a rightward shift determination signal line WSFTR for write. A failed address data signal FADDR for MUXWSR and a relief area selection signal WSEL for write are fed into one clocked inverter CLKINV.

When the relief area <0> is selected, the relief area selection signal WSEL<0> for write becomes 'H' and the relief area selection signal WSEL<1> for write becomes 'L' in the leftward shift determination multiplexer circuit 812 for write. In this case, the clocked inverter CLKINV<0> provides the inverted information of the failed address data signal FADDL<0> for MUXWSL and the clocked inverter CLKINV<1> becomes the high-impedance state, which exerts no influence on operation of the circuit. As a result, the leftward shift determination signal line WSFTL for write is given the bit information associated with the failed address data signal FADDL<0> for MUXWSL as it is.

When the relief area <1> is selected on the other hand, the relief area selection signal WSEL<1> for write becomes 'H' and the relief area selection signal WSEL<0> for write becomes 'L'. In this case, the clocked inverter CLKINV<1> provides the inverted information of the failed address data signal FADDL<1> for MUXWSL and the clocked inverter CLKINV<0> becomes the high-impedance state, which exerts no influence on operation of the circuit. As a result, the leftward shift determination signal line WSFTL for write is given the bit information associated with the failed address data signal FADDL<1> for MUXWSL as it is.

The rightward shift determination multiplexer circuit 813 for write operates in a similar manner though it is omitted from the following description.

In accordance with the combination of the leftward shift determination signal line WSFTL for write and the rightward shift determination signal line WSFTR for write, the write switch 811 selects among the selection-intended shared DQ buffers 70-72.

In this way, the leftward shift determination multiplexer circuit 812 for write and the rightward shift determination multiplexer circuit 813 for write transmit the information about the failed address data signal FADDL for MUXWSL and the failed address data signal FADDR for MUXWSR to the write switch 811 to control the write switch 811 in accordance with the accessed relief area (memory block).

During DRAM operation, either the relief area <0> or the relief area <1> is always selected. Accordingly, it is not caused in this state that neither the relief area <0> nor the relief area <1> is selected and that both are selected.

As described above in detail with the use of FIG. 3, the device is structured to receive the global write data signal WD at the write switch 811. In addition, the write data latch WDLTC is arranged closer to the interface unit 5 than the write switch 811. Thus, operation of the write switch 811 is given a temporal margin, which is described with the use of FIG. 5.

Figure 5:
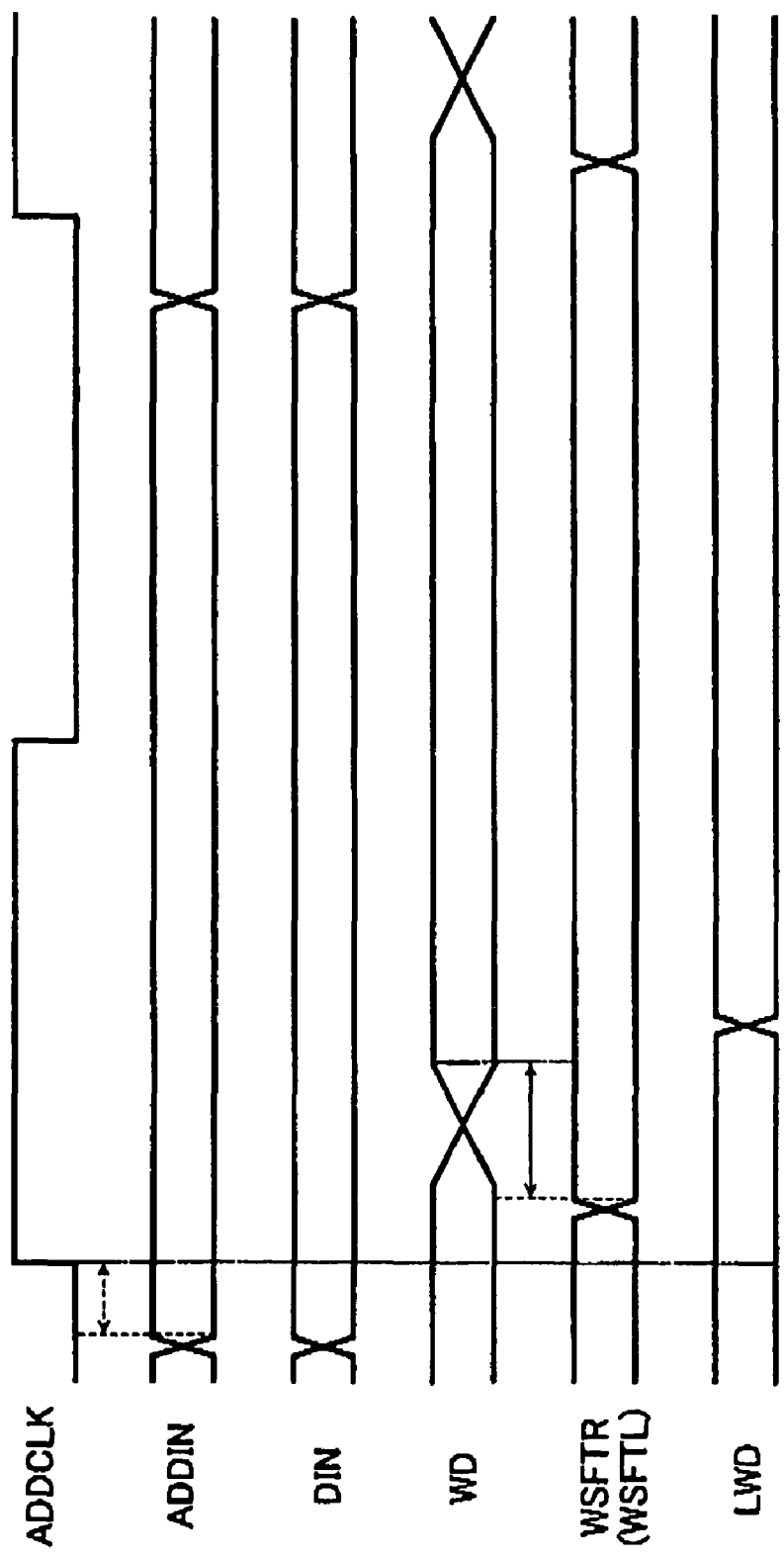
FIG. 5 is a timing chart showing operation in the same embodiment.

FIG. 5 shows timing of transitions of the signals in FIG. 3, with a margin caused in a period of time after the point of change in the rightward shift determination signal line WSFTR for write (or the leftward shift determination signal line WSFTL for write) until the determination of the global write data signal WD (that is, a time shown with the arrow of the solid line in the figure). It is sufficient for the write switch 811 to finish the shift until the global write data signal WD becomes determined. The global write data signal WD, though, has a longer wiring length and a larger parasitic capacity. Accordingly, it takes time to make the global write data signal WD determined. Therefore, the write operation of DRAM does not rate-determine the shift operation of the write switch 811 in that structure, which can realize fast DRAM operation.

Further, areas relived by one dynamic data shift redundancy circuit block 8 can be determined always only 2 in number such that 1-bit information of the address ADDIN<i> fed from external is assigned as it is to specify the relief area <0:1>. As a result, the control of decoding the address ADDIN at the address decoder is not required before the address latch 13 latches the address ADDIN fed from external. Thus, the write operation of DRAM can be prevented from rate determining in accordance with the time of decoding the address ADDIN at the address decoder. In a word, even if the time shown with the dashed-line arrow in FIG. 5 (the time after the input to the address ADDIN until the address latch) is short, the address latch 13 can latch the address ADDIN at a desired rise edge of the address latch timing clock. Thus, the margin of the set-up time can be improved and fast DRAM operation can be achieved.

Figure 6:
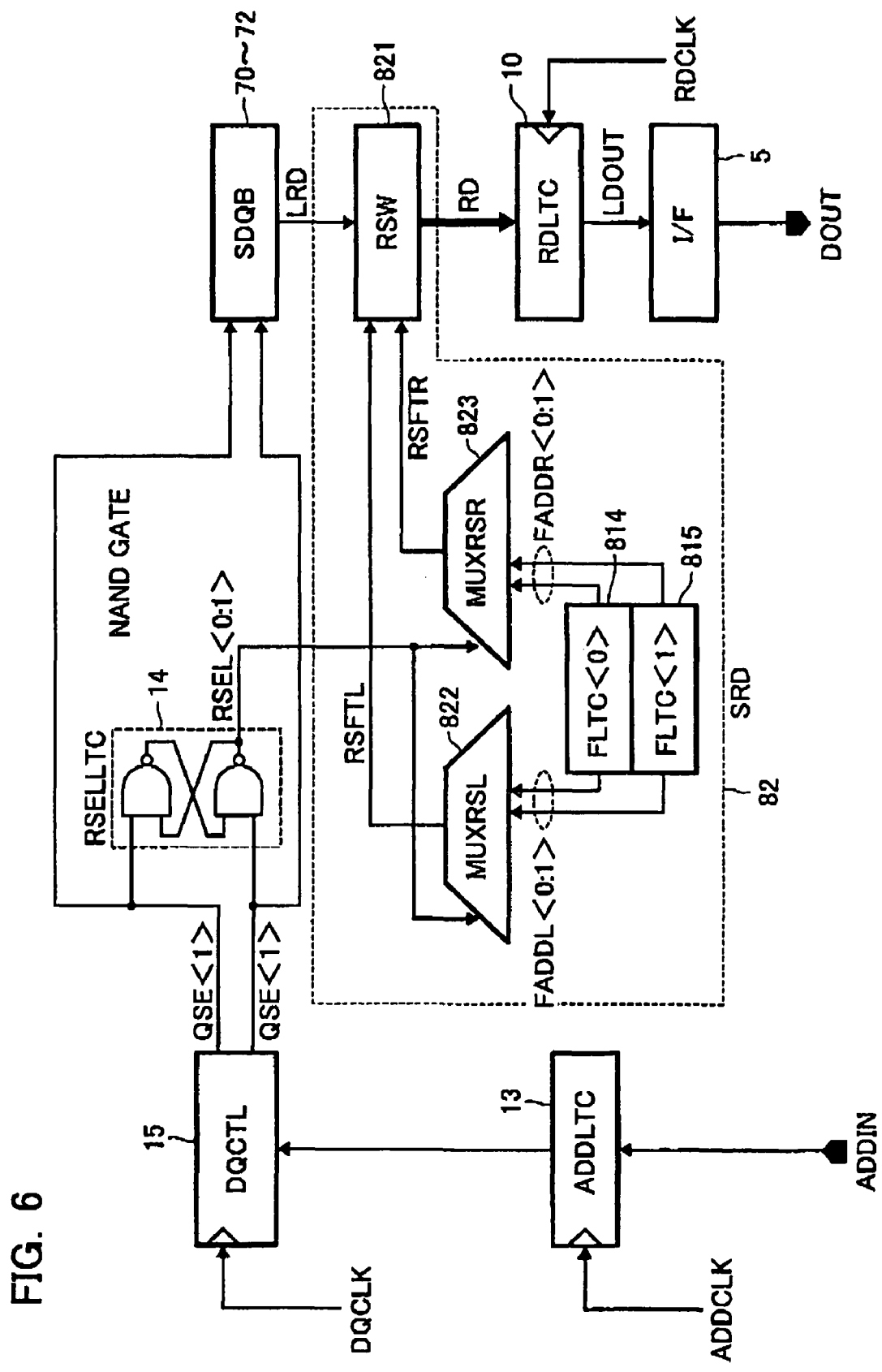
FIG. 6 is a block diagram showing in detail the periphery of the dynamic data shift redundancy circuit block at the time of read in the same embodiment.

FIG. 6 is a block diagram showing in detail an internal configuration of one of plural dynamic data shift redundancy circuits 82 contained in the dynamic data shift redundancy circuit block 8, the input/output of signals, and relations between other characteristic circuit blocks, in read operation. Inside the dynamic data shift redundancy circuit 82, a read switch (RSW) 821 is connected to a leftward shift determination multiplexer circuit (MUXRSL) 822 for read via a leftward shift determination signal line RSFTL for read. The read switch 821 is also connected to a rightward shift determination multiplexer circuit (MUXRSR) 823 for read via a rightward shift determination signal line RSFTR for read. The leftward shift determination multiplexer circuit 822 for read is connected to the failed address latches 814, 815 via failed address data lines FADDL<0:1> for MUXRSL. The rightward shift determination multiplexer circuit 822 for read is connected to the failed address latches 814, 815 via failed address data lines FADDR<0:1> for MUXRSR.

Figure 7:
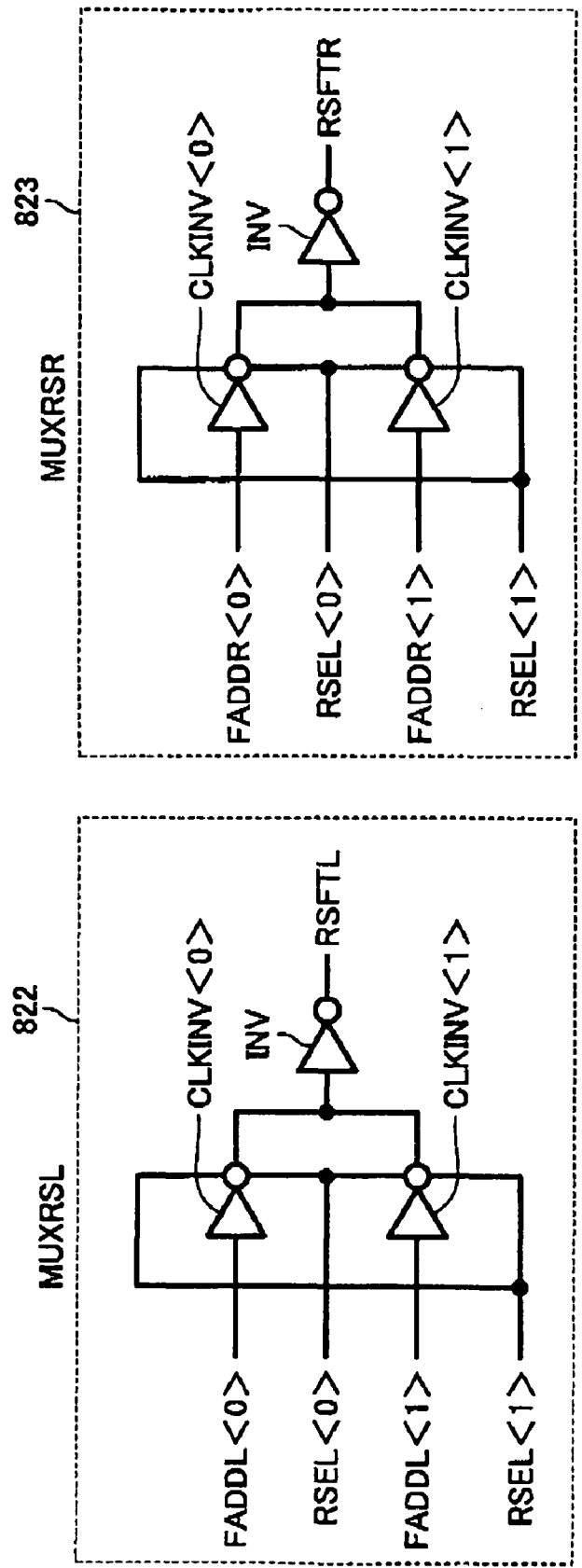
FIG. 7 is a detailed circuit diagram of multiplexer circuits for read in the same embodiment.

FIG. 7 shows detailed circuitry of the leftward shift determination multiplexer circuit 822 for read and the rightward shift determination multiplexer circuit 823 for read. This circuitry is similar to that for write shown in FIG. 4, which includes the relief area selection signal line WSEL for write, the leftward shift determination signal line WSFTL for write, and the rightward shift determination signal line WSFTR for write. These lines are replaced in FIG. 7 with a relief area selection signal line RSEL for read, a leftward shift determination signal line RSFTL for read, and a rightward shift determination signal line RSFTR for read.

These leftward shift determination multiplexer circuit 822 for read and rightward shift determination multiplexer circuit 823 for read are connected to a relief area selection latch (RSELLTC) 14 for read via relief area selection signal lines RSEL<0:1> for read. The relief area selection latch 14 is connected to a DQB control (DQCTL) 15 via SDQB control signal lines QSE<0:1>. The DQ control 15 is connected to the shared DQ buffers 70-72 via the SDQB control signal lines QSE<0:1> to control timing of read operation of the shared DQ buffers 70-72 with SDQB control signals QSE<0:1>. The DQ control 15 is connected to the address latch 13 via an address line ADD. The DQ control 15 operates in synchronization with a rise edge of the DQ control timing clock DQCLK. The address latch 13 latches an address ADDIN received from external in synchronization with a rise edge of an address latch timing clock ADDCLK.

The shared DQ buffers 70-72 are connected to the read switch 811 through local read data lines LRD. The read switch 811 is connected to a read data latch (RDLTC) 10 via global read data lines RD. The read data latch 10 is connected to the interface unit 5 via local data-out signal lines LDOUT. The data read out to outside the DRAM or a data-out signal DOUT is provided to external from the interface unit 5. The read data latch 10 latches a global read data signal RD in synchronization with a rise edge of a read data latch timing clock RDCLK. Read data is provided to external as the local data read data signal LRD, the global read data signal RD, and the local data-out signal LDOUT, and the data-out signal DOUT in order.

In this way, the SDQB control signals QSE<0:1> for use in control of timing of read operation of the DQ buffers 70-72 already shared can be used to generate the relief area selection signal RSEL<0:1> for read. Thus, the additional circuit is only the relief area selection latch 14 for read, which can avoid the circuit and control to be complicated.

Figure 8B:
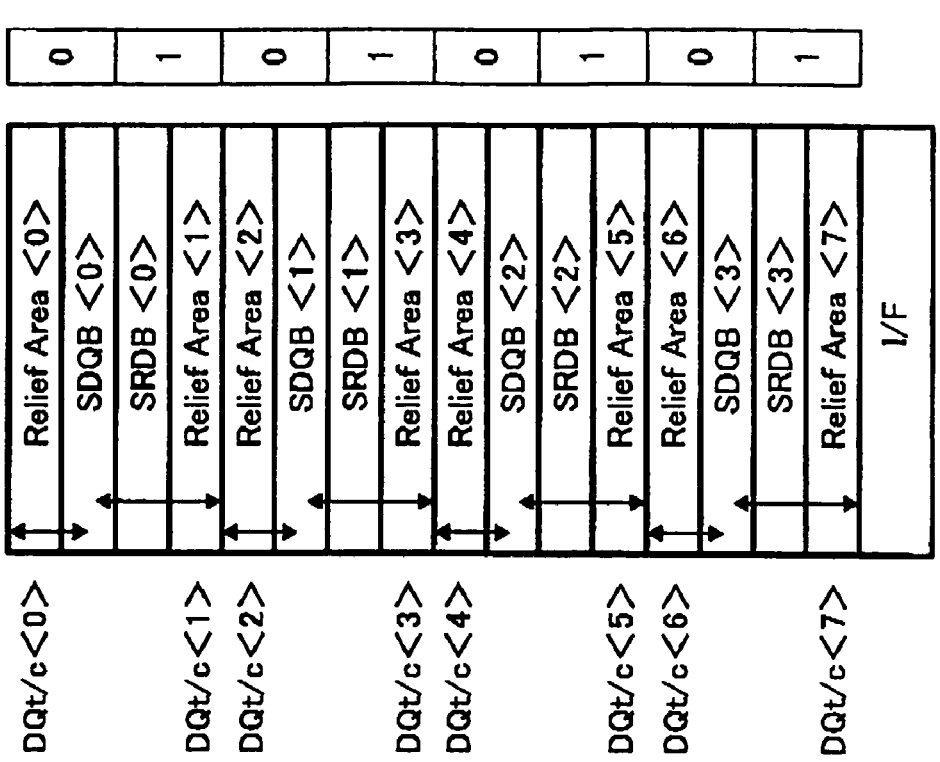
FIG. 8B provides a diagram illustrative of a macro-size expansion method in the same embodiment.
Figure 8A:
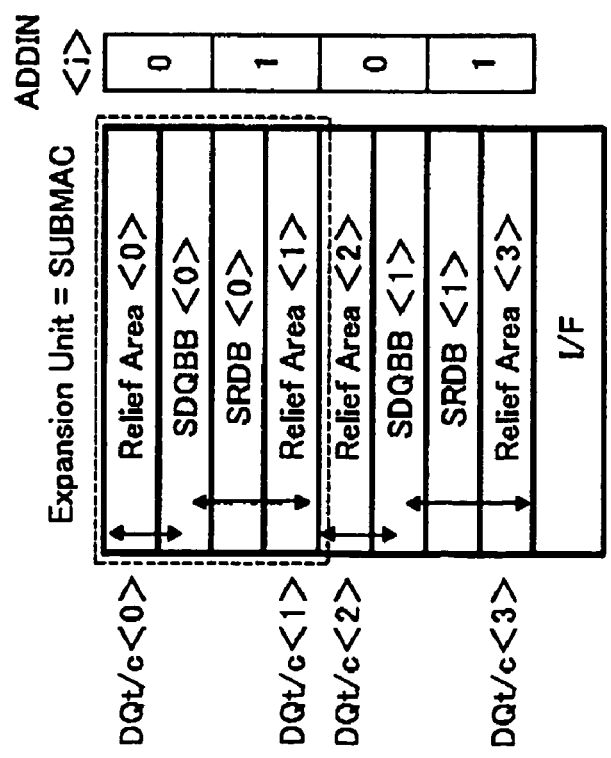
FIG. 8A provides a diagram illustrative of a macro-size expansion method in the same embodiment.

FIGS. 8A and 8B show macro-size expansion methods. In the DRAM of the present invention, the expansion unit is a submacro SUBMAC. It is structured to have DQ buffer blocks SDQBB and dynamic data shift redundancy circuit blocks SRDB, which are shared per expansion unit. The areas to be relived by each dynamic data shift redundancy circuit block SRDB include only 2 memory blocks contained inside the expansion unit. Accordingly, macro-size expansion can be achieved with an increase in the number of submacros SUBMAC, each of which is the expansion unit. Further, the use of the leftward shift determination multiplexer circuit MUXWSL for write and the rightward shift determination multiplexer circuit MUXWSR for write and of the leftward shift determination multiplexer circuit MUXRSL for read and the rightward shift determination multiplexer circuit MUXRSR for read allows the relief area to be selected with only 1 bit of the address ADDIN<i> fed from external. For example, the expansion of macros from the size of FIG. 8A to the size of FIG. 8B only requires 2 submacros SUBMAC to be added and stacked, each of which is the expansion unit, and accordingly can realize DRAMs with excellent expandability. In this case, it is required to increase 2 in the number of the submacro control circuits SUBMACCTL. In FIG. 8, though, the submacro control circuits SUBMACCTL and the address command latches ADDCOMLTC are not essential and accordingly omitted from the figure.

Figure 9B:
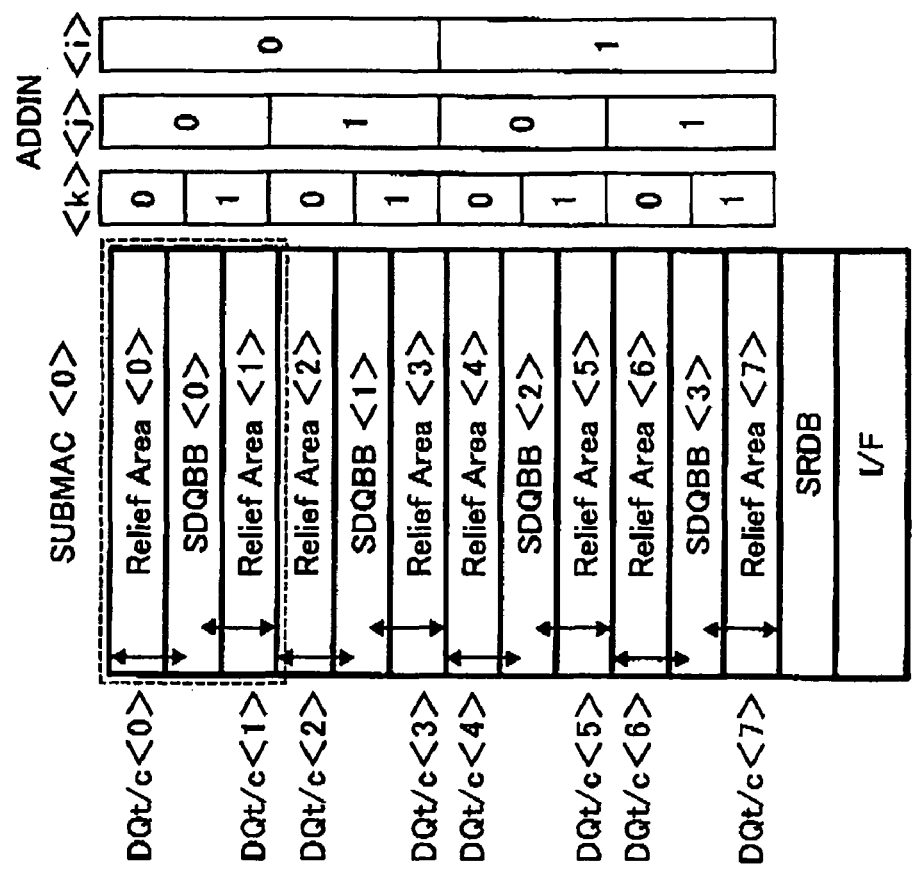
FIG. 9B provides a diagram illustrative of a macro-size expansion method in a comparison example.
Figure 9A:
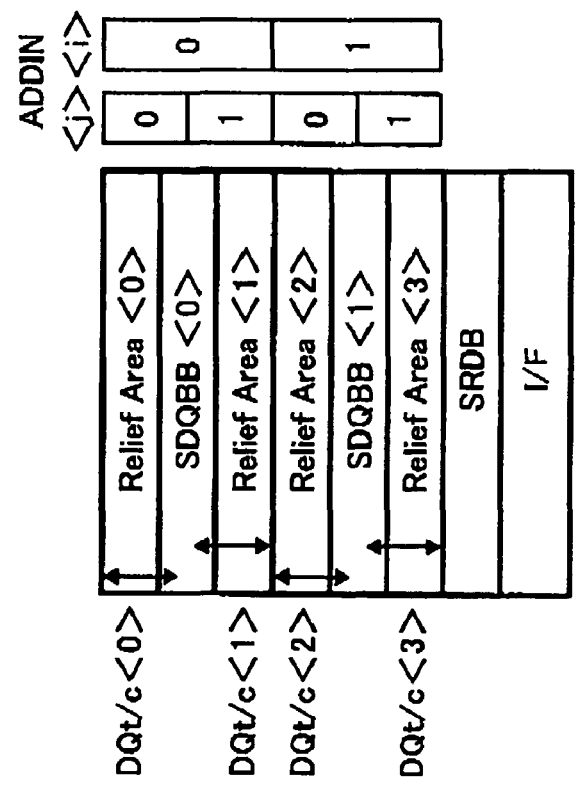
FIG. 9A provides a diagram illustrative of a macro-size expansion method in a comparison example.
Figure 9C:
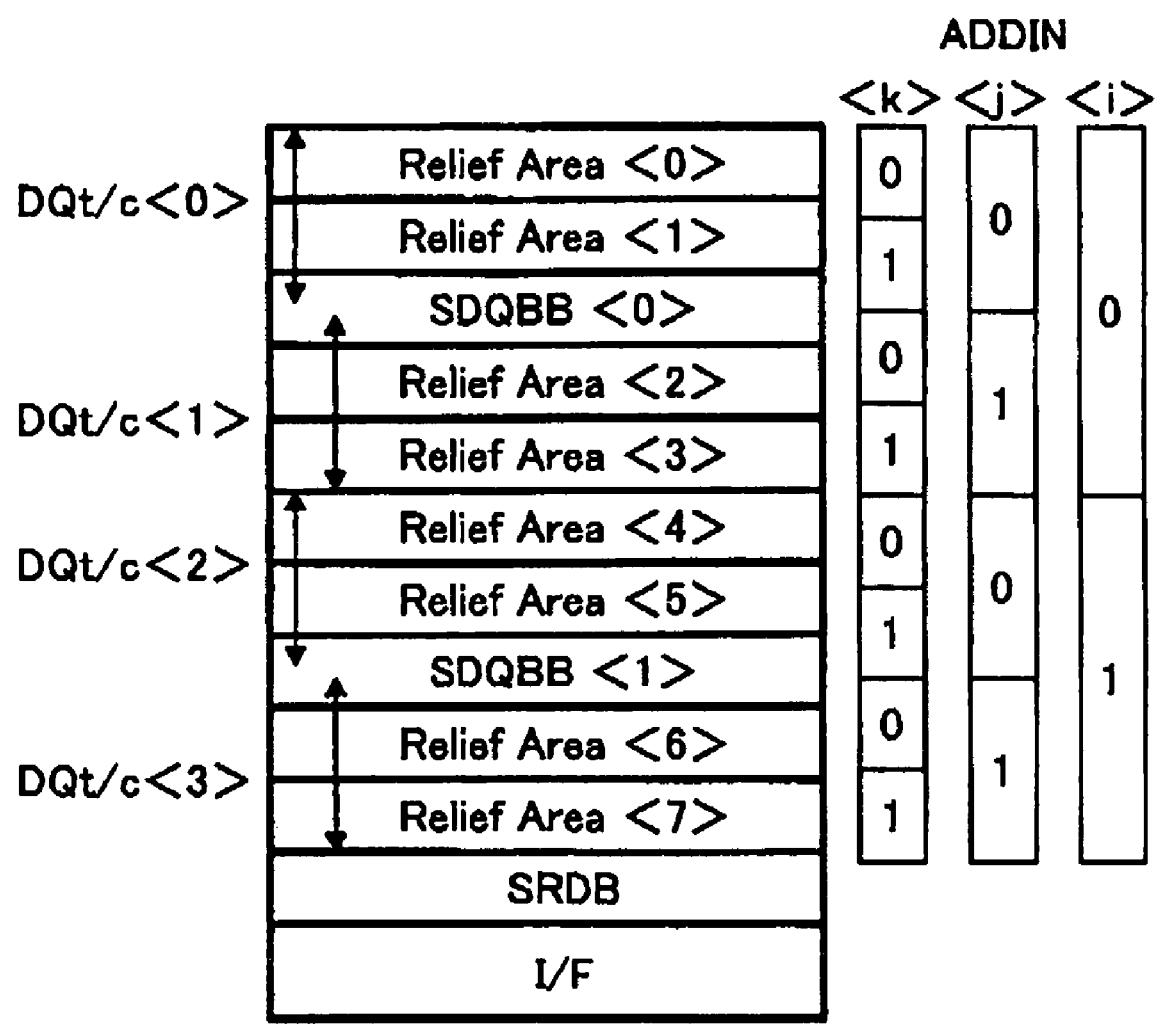
FIG. 9C provides a diagram illustrative of a macro-size expansion method in a comparison example.

In contrast, in the structures shown in FIGS. 9A and 9B, the dynamic data shift redundancy circuit block SRDB relieves all relief areas. In this case, if the submacros SUBMAC in FIGS. 9A and 9B are increased in number to expand the size, the bits in the address ADDIN required for selecting the relief area are increased in number (requiring more extra ADDIN<k> than FIG. 9A). This results in a larger size of the address decoder ADDDEC, which leads to an additional delay. The memory blocks contained in one submacro SUBMAC may be increased in number to expand the macro-size as shown in FIG. 9C. This results in a much larger size of the address decoder ADDDEC, which leads to an additional delay. In addition, the lengths of the complementary data lines DQt/c are elongated to result in a lowered speed. Therefore, the macro structure is extremely poor in expandability.

With this regard, the present invention makes it possible to reduce the number of bits in the address required for selecting the relief area and expand the memory size while keeping fast accessibility.

What is claimed is:

1. A semiconductor memory device, comprising:
a plurality of submacros mutually connected via global data lines,
each of said submacros including:
a first and a second memory block, and
a memory block control circuit arranged between said first and second memory blocks,
said first block control circuit including:
a DQ buffer block connected to said first memory block via first complementary data lines and connected to said second memory block via second complementary data lines;
a dynamic data shift redundancy circuit block connected to said DQ buffer block via local data lines and operative to relieve said first and second memory blocks;
an address latch operative to latch an address received from external; and
a DQ buffer control circuit operative to receive said address latched at said address latch and generate a DQ buffer control signal to control said DQ buffer block,
wherein said dynamic data shift redundancy circuit block selects a relief area at the time of read operation utilizing a DQ buffer control signal generated at said DQ buffer control circuit.

2. The semiconductor memory device according to claim 1, said dynamic data shift redundancy circuit block includes a first and a second failed address latch operative to store failed address information associated with said first and second memory blocks.

3. The semiconductor memory device according to claim 2, further comprising:
an interface unit operative to execute data communications with external; and
a data latch operative to latch write data or read data to be transferred to/from said interface unit, wherein
said dynamic data shift redundancy circuit block includes
a switch connected to said data latch via said global data lines and connected to said DQ buffer block via said local data lines,
a leftward shift determination multiplexer circuit operative to receive a relief area selection signal given via said address latch and failed address signals from said first and second address latches and provide a leftward shift determination signal, and
a rightward shift determination multiplexer circuit operative to receive said relief area selection signal given via said address latch and failed address signals from said first and second address latches and provide a rightward shift determination signal,
wherein said switch selects said local data line to be replaced during write or read operation in accordance with a combination of said leftward shift determination signal and said rightward shift determination signal.

4. A semiconductor memory device comprising:
a first and a second memory block;
a DQ buffer block connected to said first memory block via first complementary data lines and connected to said second memory block via second complementary data lines;
a dynamic data shift redundancy circuit block connected said DQ buffer block via local data lines and operative to relieve said first and second memory blocks in accordance with information of one bit in an arbitrary address received from external;
an address latch operative to latch an address received from external; and
a DQ buffer control circuit operative to receive said address latched at said address latch and generate a DQ buffer control signal to control said DQ buffer block,
wherein said dynamic data shift redundancy circuit block selects a relief area at the time of read operation utilizing a DQ buffer control signal generated at said DQ buffer control circuit.

5. The semiconductor memory device according to claim 4, said dynamic data shift redundancy circuit block includes a first and a second failed address latch operative to store failed address information associated with said first and second memory blocks.

6. The semiconductor memory device according to claim 5, further comprising:
- an interface unit operative to execute data communications with external; and
- a data latch operative to latch write data or read data to be transferred to/from said interface unit,
- said dynamic data shift redundancy circuit block includes
  - a switch connected to said data latch via said global data lines and connected to said DQ buffer block via said local data lines,
  - a leftward shift determination multiplexer circuit operative to receive a relief area selection signal given via said address latch and failed address signals from said first and second address latches and provide a leftward shift determination signal, and
  - a rightward shift determination multiplexer circuit operative to receive a relief area selection signal given via said address latch and failed address signals from said first and second address latches and provide a rightward shift determination signal,
- wherein said switch selects said local data line to be replaced during write or read operation in accordance with a combination of said leftward shift determination signal and said rightward shift determination signal.

7. A semiconductor memory device comprising:
- a plurality of submacros each including a first and a second memory block,
- a certain one of said submacros, independent of the other of said submacros, includes
  - a DQ buffer block connected to said first memory block via first complementary data lines and connected to said second memory block via second complementary data lines,
  - a dynamic data shift redundancy circuit block connected to said DQ buffer block via local data lines and operative to relieve said first and second memory blocks,
  - an address latch operative to latch an address received from external, and
  - a DQ buffer control circuit operative to receive said address latched at said address latch and generate a DQ buffer control signal to control said DQ buffer block,
- wherein said dynamic data shift redundancy circuit block selects a relief area at the time of read operation utilizing a DQ buffer control signal generated at said DQ buffer control circuit.

8. The semiconductor memory device according to claim 7, said dynamic data shift redundancy circuit block includes a first and a second failed address latch operative to store failed address information associated with said first and second memory blocks.

9. The semiconductor memory device according to claim 8, further comprising:
- an interface unit operative to execute data communications with external; and
- a data latch operative to latch write data or read data to be transferred to/from said interface unit,
- said dynamic data shift redundancy circuit block includes
- a switch connected to said data latch via said global data lines and connected to said DQ buffer block via said local data lines,
- a leftward shift determination multiplexer circuit operative to receive a relief area selection signal given via said address latch and failed address signals from said first and second address latches and provide a leftward shift determination signal, and
- a rightward shift determination multiplexer circuit operative to receive a relief area selection signal given via said address latch and failed address signals from said first and second address latches and provide a rightward shift determination signal,
- wherein said switch selects said local data line to be replaced during write or read operation in accordance with a combination of said leftward shift determination signal and said rightward shift determination signal.

* * * * *